United States Patent
Ilchmann

(10) Patent No.: US 6,956,400 B2
(45) Date of Patent: Oct. 18, 2005

(54) CONVERTER FROM ECL TO CMOS AND NETWORK ELEMENT FOR TRANSMITTING SIGNALS

(75) Inventor: Frank Ilchmann, Berlin (DE)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/716,475

(22) Filed: Nov. 20, 2003

(65) Prior Publication Data

US 2004/0119498 A1 Jun. 24, 2004

(30) Foreign Application Priority Data

Dec. 18, 2002 (EP) .............................. 02360362

(51) Int. Cl.[7] .......................................... H03K 19/0175
(52) U.S. Cl. ............................. 326/66; 326/73; 326/77
(58) Field of Search ............................... 326/66, 73, 77

(56) References Cited

U.S. PATENT DOCUMENTS

| | | | | |
|---|---|---|---|---|
| 5,264,745 A | * | 11/1993 | Woo | .............................. 326/62 |
| 5,426,381 A | | 6/1995 | Flannagan et al. | |
| 5,528,171 A | * | 6/1996 | Doi et al. | ...................... 326/66 |
| 5,726,588 A | | 3/1998 | Fiedler | |
| 6,252,421 B1 | | 6/2001 | Kiriaki | |

FOREIGN PATENT DOCUMENTS

| | | |
|---|---|---|
| BE | 1 004 501 | 12/1992 |
| EP | 000584946 A2 * | 3/1994 ................... 326/73 |
| JP | 03228429 * | 10/1991 ................... 326/77 |

OTHER PUBLICATIONS

Patent Abstracts of Japan, vol. 2003, No. 02, Feb. 5, 2003 corresponding to JP 2002 319857 A (NEC Eng Ltd) dated Oct. 31, 2002.
Patent Abstracts of Japan, vol. 018, No. 603 (E–1632), Nov. 16, 1994 corresponding to JP 06 232726 A (Hitachi Ltd) dated Aug. 19, 1994.
Patent Abstracts of Japan, vol. 018, No. 467 (E–1599), Aug. 30, 1994 corresponding to JP 06 152379 A (Fujitsu Ltd) dated May 31, 1994.
Patent Abstracts of Japan, vol. 018, No. 675 (E–1648), Dec. 20, 1994 corresponding to JP 06 268599 A (Hitachi LTD) dated Sep. 22, 1994.

* cited by examiner

Primary Examiner—Daniel D. Chang
(74) Attorney, Agent, or Firm—Sughrue Mion, PLLC

(57) ABSTRACT

The invention relates to a converter from ECL to CMOS having an input stage (Q1, Q2, N3, N4), a level shifter stage (N1, N2, N5, R1, R2, R3) including an NFET differential stage (N1, N2), and an output stage (P1, P2, P3, P4, N6, N7, N8, N9), and to a network element for transmitting signals which comprises a converter from ECL to CMOS having an input stage (Q1, Q2, N3, N4), a level shifter stage (N1, N2, N5, R1, R2, R3), and an output stage (P1, P2, P3, P4, N6, N7, N8, N9), with the level shifter stage (N1, N2, N5, R1, R2, R3) including an NFET differential stage (N1, N2).

4 Claims, 4 Drawing Sheets

US 6,956,400 B2

CONVERTER FROM ECL TO CMOS AND NETWORK ELEMENT FOR TRANSMITTING SIGNALS

TECHNICAL FIELD

This invention relates to a converter from ECL to CMOS as set forth in the preamble of claim 1 and to a network element for transmitting signals as set forth in the preamble of claim 5.

The invention is based on a priority application, EP 02360362.4, which is hereby incorporated by reference.

BACKGROUND OF THE INVENTION

Logic converters are used to adapt different logic levels. An input signal is converted in accordance with logic-potential definitions. The function of the converter is to convert the signals with corresponding frequency. Such signals occur, for example, between active components within a chip or between two chips. These components may be close together or far apart. Such components may be linked by a bus, for example. Another application is if the components are incorporated in network elements which are far apart.

Signal-exchanging systems or generally telecommunications systems and networks are designed to exchange (electric) signals reliably, without errors, and as fast as possible. This is accomplished by using defined uniform transmission rates (frequencies) and defined amplitudes, for example.

Differential emitter-coupled logic (ECL) circuitry is often used in high-speed data transmission applications because of its higher speed of operation and its advantageous signal characteristics. The differential aspect of these low-level signals provides a good signal-to-noise ratio, for example.

It is technologically possible and desirable to convert low-level ECL signals to signals of higher levels, such as those of complementary metal oxide semiconductor (CMOS) logic circuits, without a significant degradation in speed, so that such a converter can drive CMOS circuits.

Known ECL to CMOS converters make the conversion at the expense of speed and/or drive capability. ECL can be switched faster than CMOS, but attempts to speed up the conversion process often diminish the output drive capability of the circuit. Circuits with this disadvantage are described in U.S. Pat. No. 5,726,588 or U.S. Pat. No. 5,426,381.

The conversion of ECL signals to CMOS signals is commonly performed in three stages. An input stage receives and buffers the ECL signals, which are applied with a voltage swing of a few 100 mV referenced to the positive supply voltage. A level shifter stage shifts the ECL levels in the direction of the CMOS switching threshold and increases the voltage swing, and an output stage forms the CMOS-compatible output signal.

The invention starts from a converter circuit which does not have the above-described disadvantage. This converter circuit is disclosed in U.S. Pat. No. 6,252,421 and shown in FIG. 1.

This circuit has the following drawbacks. The level shifter is a bipolar differential stage 20, . . . , 24 whose output signals are used to drive CMOS inverters 25, . . . , 28 and 37, . . . , 40. If this arrangement is operated on low supply voltages, e.g., below 3 volts, the output level for the low state can no longer reach the CMOS switching level, which is usually one half the supply voltage.

This is due to the circuit technology used for the level shifter 20, . . . , 24. The differential stage 20, . . . , 23 requires a current source 24 across which a voltage drop of typically 0.8 V is developed. The voltage drop across the switching transistors 22, 23 of differential stage 20, . . . , 23 corresponds to the on-state voltage, typically also approximately 0.8 V. Because of the saturation effect, the collector potential must not fall below the base potential, i.e., the output level for the low state cannot decrease below 1.6 V. Accordingly, the CMOS switching threshold must be above 1.6 V. This gives a minimum possible supply voltage of approximately 1.6V·2=3.2V.

By means of an unbalanced design of the inverters 25, . . . , 28 and 37, . . . , 40, which are driven by the differential stage 20, . . . , 23, this voltage can be slightly reduced. However, the unbalanced inverters result in longer switching times.

Another disadvantage of the prior-art solutions is that the level shifter 20, . . . , 24 has a relatively large voltage swing, since the bipolar differential stage 20 . . . , 23 switches from the minimum level for the low state to the level of the supply voltage for the high state. The large voltage swing results in relatively long switching times.

SUMMARY OF THE INVENTION

The object of the invention is to rapidly convert differential ECL input signals to differential CMOS signals at low supply voltages and thus transmit signals between and in network elements at higher speeds and more efficiently.

According to the invention, this object is attained by a converter from ECL to CMOS having an input stage, a level shifter stage, and an output stage, with the level shifter stage including an NFET differential stage. The input stage and/or the level shifter stage preferably incorporate a switching-threshold control system. The ECL to CMOS converter preferably comprises means for generating a reference voltage for current-source transistors to control the switching threshold. These means preferably comprise a simulating network for portions of the converter to determine the reference voltage.

Furthermore, the invention resides in the provision of a network element for transmitting signals which comprises a converter from ECL to CMOS having an input stage, a level shifter stage, and an output stage, with the level shifter stage including an NFET differential stage.

By an NFET differential stage, the ECL signals are brought to the range of the CMOS switching threshold. This form of drive also operates at low supply voltages.

Through the small number of active components, the propagation delay of the level conversion is greatly reduced. Propagation delays below 200 ps are achieved. The small number of components is also advantageous in that the chip area required is small.

In particular, the circuit is suited for low supply voltages (e.g., 2.5 V).

Another advantage is that the level conversion is insensitive to variations in temperature, supply voltage, and technology parameters. This facilitates the selection of appropriate values for the individual components.

BRIEF DESCRIPTION OF THE DRAWINGS

The invention will now be explained in more detail with reference to the accompanying drawings, in which.

DETAILED DESCRIPTION OF THE DRAWINGS

Figure 1:
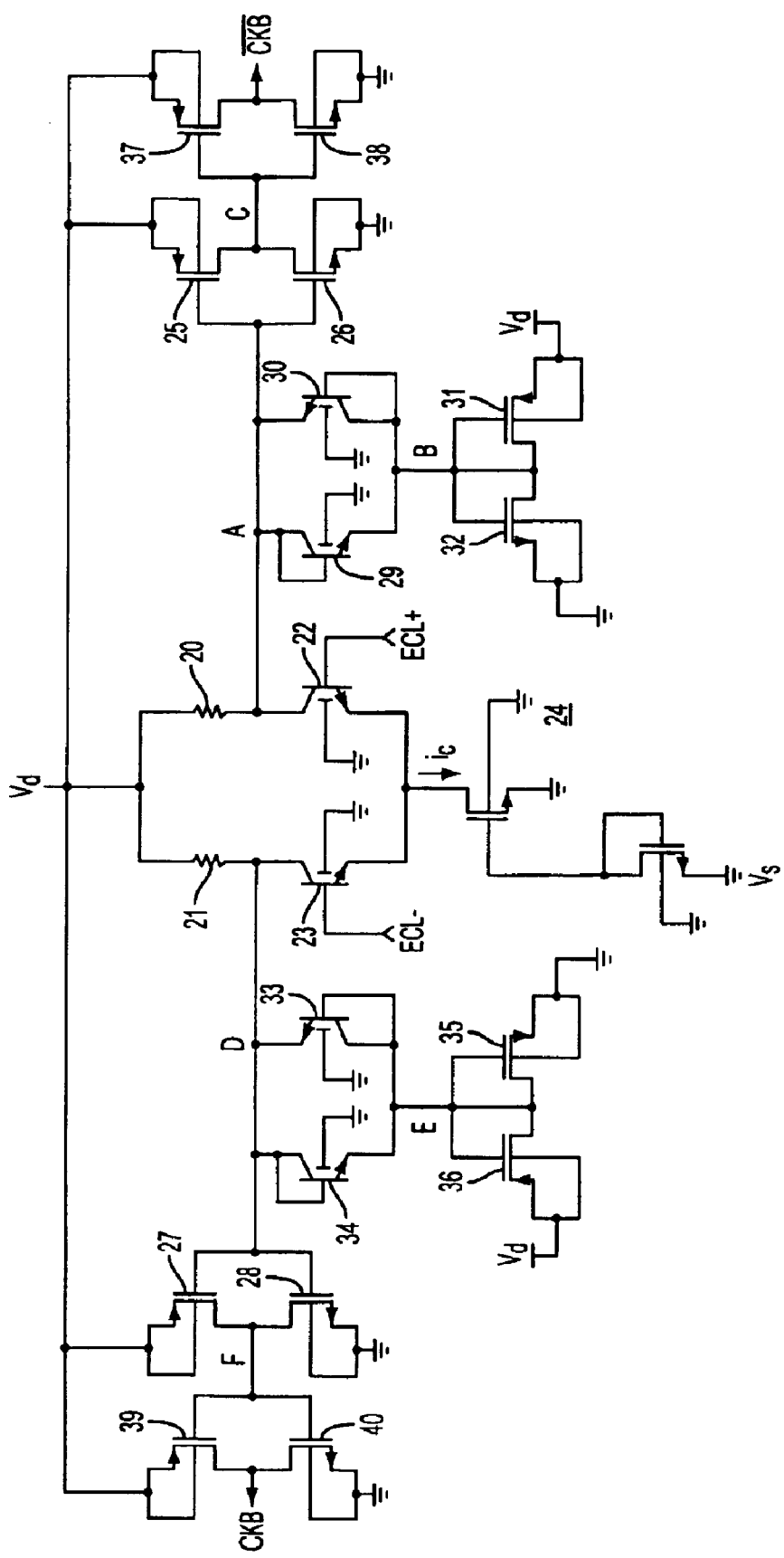
FIG. 1 shows a prior-art converter from ECL to CMOS.
Figure 2:
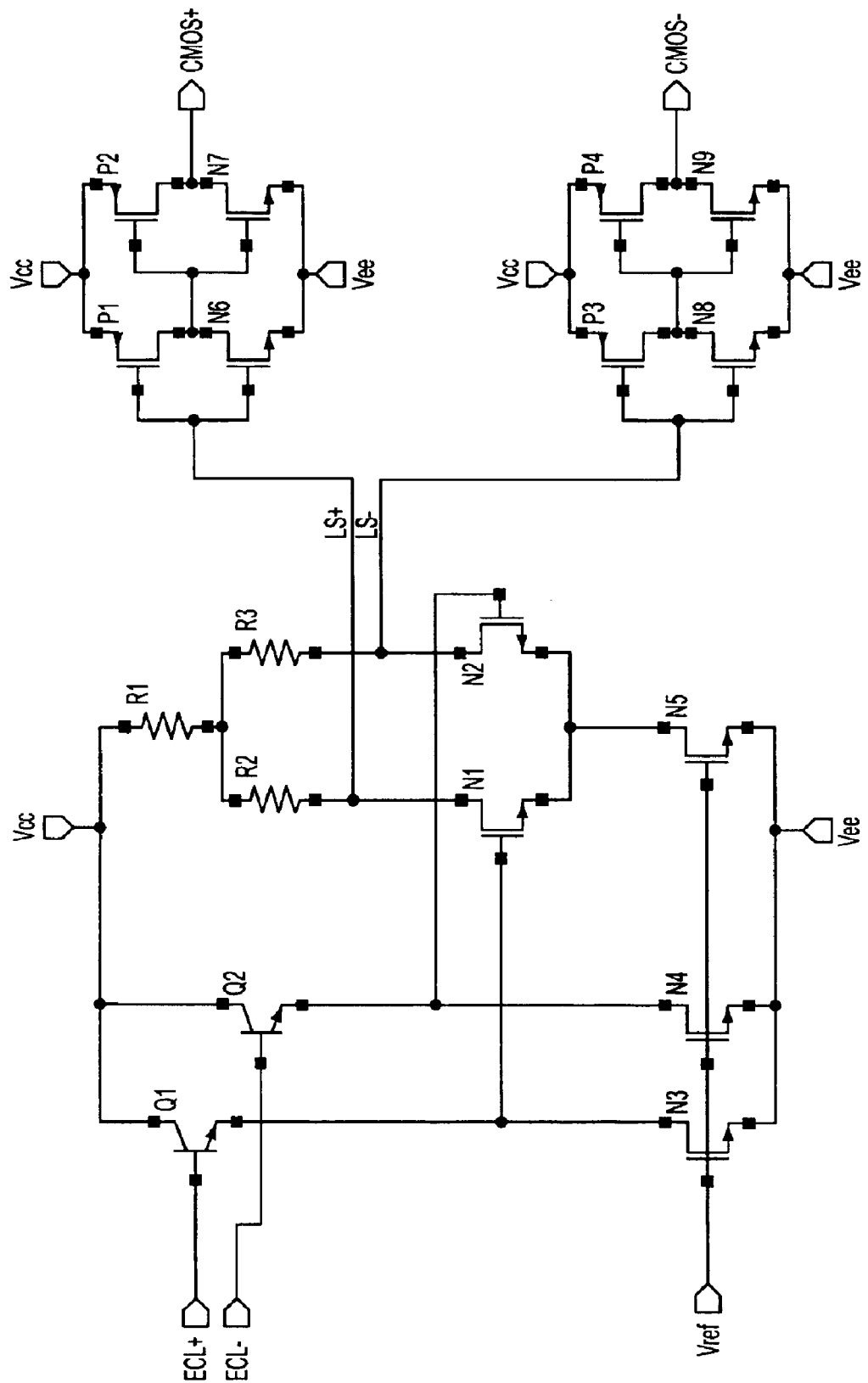
FIG. 2 shows an ECL to CMOS converter according to the present invention.

First, the basic operation of the circuit of a converter from ECL to CMOS will be explained with the aid of FIG. 2.

The converter from ECL to CMOS is composed of an input stage, a level shifter stage, and an output stage. The input stage consists of an emitter follower Q1, Q2, N3, N4. The level shifter stage is an NFET differential stage N1, N2, N5, R1, R2, R3. The subsequent output stage is composed of CMOS inverters P1/N6, P2/N7, P3/N8, P4/N9 for pulse shaping.

Through the use of NFETs N1 and N2 in the differential stage, the output level for the low state can be substantially lower than in a bipolar solution, since in FETs the drain potential may be below the gate potential.

Furthermore, the voltage swing of the differential stage N1, N2, N5, R1, R2, R3 is reduced by the resistor R1.

The dimensional design of this level shifter is such that at a predetermined current through the level shifter (determined by Vref), the level for the high state is determined by the voltage drop across R1, and the level for the low state is determined by the voltage drop across R1 and R2 or R3. The differential stage is so designed that with a defined ECL signal applied to the input stage, the transistors will be either on or off.

In the differential stage, either N1 or N2 will then conduct, depending on the gate potentials. If N1 is switched on (by a gate potential than higher than that at N2), the current will flow through R1, R2, N1, and N5. The drain potential LS+ of N1 will then be at low level (voltage drop across R1 and R2), and the drain potential LS− of N2 will then be at high level (only voltage drop across R1, since no current is flowing through R3). The levels set by R1 and R2/R3 should be symmetrical with respect to the switching threshold of the CMOS inverters being driven, P1/N6, P3/N8, in order to achieve fast switching.

Figure 3:
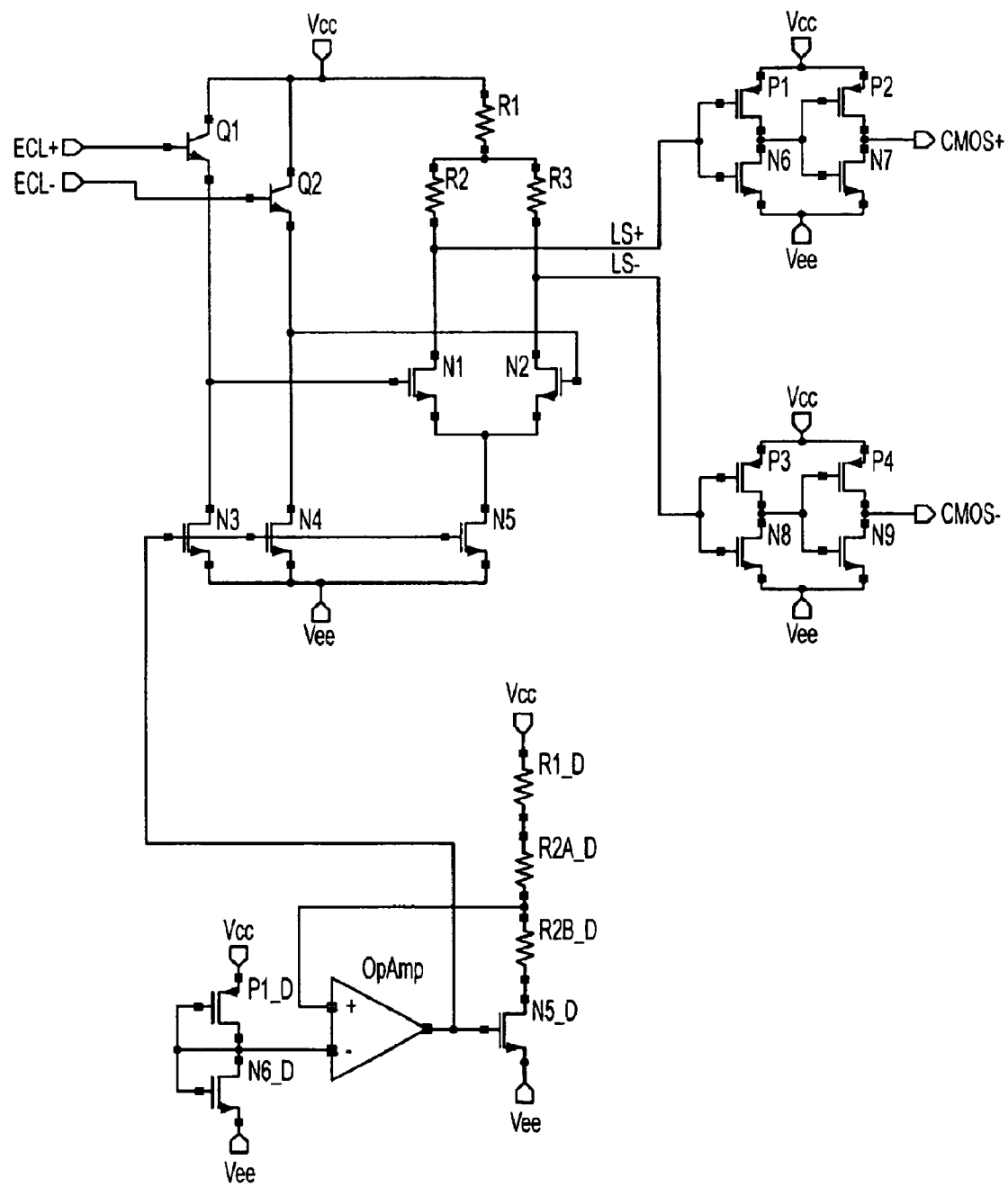
FIG. 3 shows an ECL to CMOS converter according to the present invention with switching-threshold control.

In ECL technology, shorter switching times can be achieved by increasing the currents in the differential stages. This has the disadvantage of increased power dissipation, which imposes constraints on the scale of integration and increases power consumption. How an ECL to CMOS converter with additional switching-threshold control permits the switching time to be further reduced without increasing power dissipation will now be explained with reference to FIG. 3.

By decreasing the voltage swing of the differential stage N1, N2, N5, R1, R2, R3, the switching time is reduced without increasing power dissipation. To ensure reliable operation of the converter even during variations in temperature, supply voltage, and technology parameters, the reference voltage at the current-source transistors N3, N4, N5 is controlled. The switching threshold of the CMOS inverters is used as a control standard.

This control standard is compared by an operational amplifier OpAmp with an artificially generated voltage which corresponds to the midpoint of the voltage swing of the differential stage. The control system consists of the operational amplifier OpAmp, a simulating network ("dummy") P1_D, N6_D for the CMOS inverter P3, N8 or P1, N6, and a simulating network R1_D, R2A_D, R2B_D, N5_D for the differential stage N1, N2, N5, R1, R2, R3. In the simulating network for the differential stage, R1_D has the same value as R1, and N5_D is of the same dimensional design as N5. The resistor R2 of the differential stage was divided into two equal-value resistors R2A_D and R2B_D. The voltage between the resistors R2A_D and R2B_D of the simulating network R1_D, R2A_D, R2B_D, N5_D for the differential stage N1, N2, N5, R1, R2, R3 corresponds exactly to the midpoint of the voltage swing between LS+ and LS−.

The switching threshold of the CMOS inverters P1, N6 or P3, N8 is generated by a short circuit of the simulating network P1_D, N6_D for the CMOS inverter. Via the control of the current through N5_D, the operational amplifier OpAmp pulls the artificial mid-potential in the simulating network for the differential stage to the switching threshold of the CMOS inverter.

Since the resistors and NFETs of the simulating network and the differential stage have the same values, the same levels appear in the original differential stage. As a result, the output levels of the differential stage are always centered on the switching threshold of the CMOS inverters.

Figure 4:
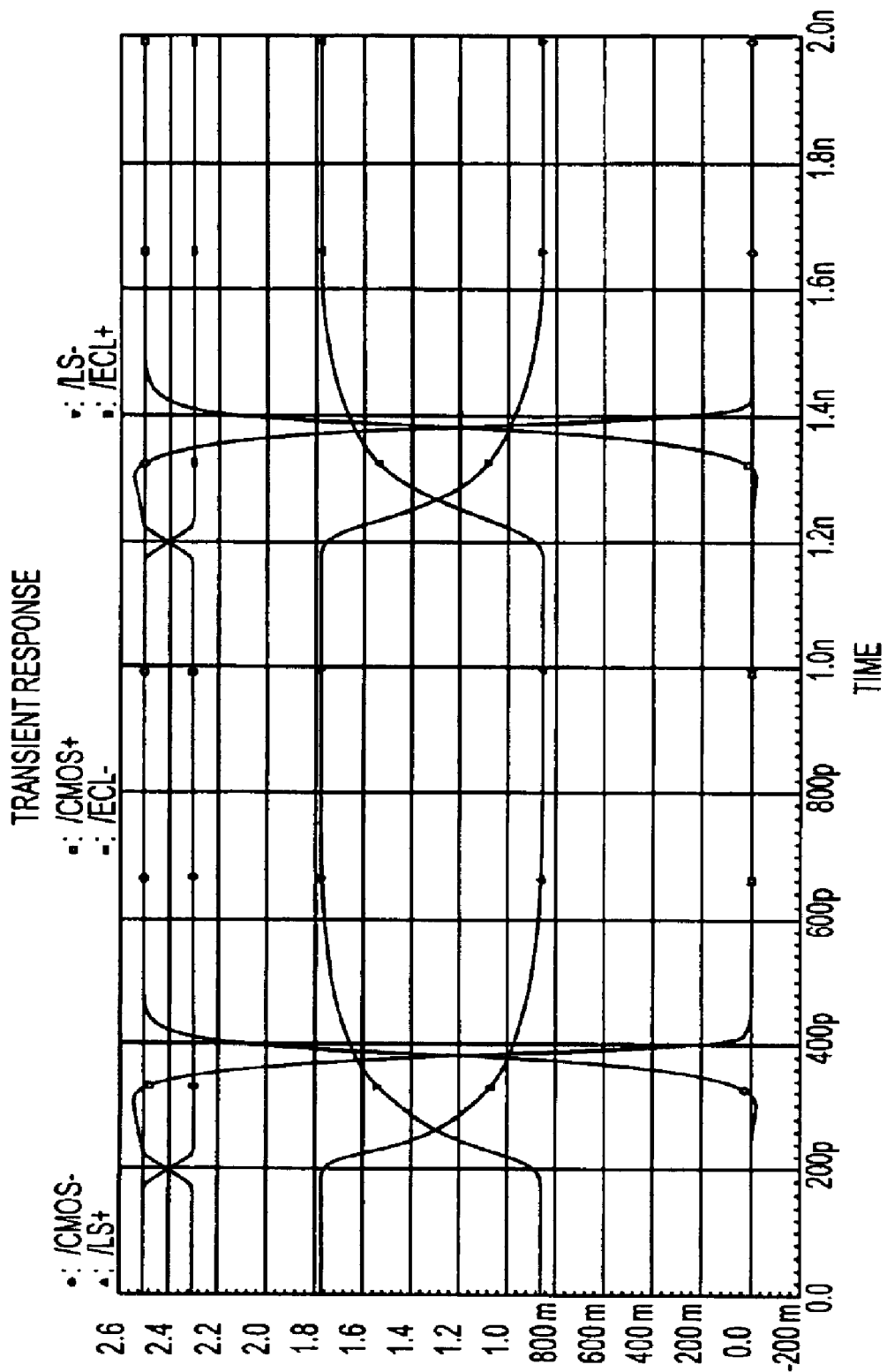
FIG. 4 shows an example of the level characteristics at an ECL to CMOS converter according to the present invention.

FIG. 4 shows the level characteristics at the ECL to CMOS level converter for a supply voltage of 2.5 volts. ECL+/ECL− are the differential ECL input signals with a voltage swing of 200 mV, and LS+/LS− are the output voltages of the level converter. CMOS+/CMOS− are the CMOS output signals.

What is claimed is:

1. A converter for converting ECL signals to CMOS signals, said converter comprising:

an input stage, a level shifter stage connected to the input stage which includes an NFET differential stage, and an output stage connected to the level shifter stages, the input stage or the level shifter stage comprising a switching-threshold control system including a simulating network which determines a reference voltage for controlling a switching threshold of the switching-threshold control system.

2. The converter of claim 1, wherein the switching threshold control system further includes current-source transistors and the reference voltage is applied to the current-source transistors to control the switching threshold.

3. A network element for transmitting signals which comprises a converter for converting ECL signals to CMOS signals, said converter comprising:

an input stage, a level shifter stage connected to the input stage which includes an NFET differential stage, and an output stage connected to the level shifter stages, the input stage or the level shifter stage comprising a switching-threshold control system including a simulating network which determines a reference voltage for controlling a switching threshold of the switching-threshold control system.

4. The network element of claim 3, wherein the switching-threshold control system further includes current-source transistors and the reference voltage is applied to the current-source transistors to control the switching threshold.

* * * * *